United States Patent
St-Roch et al.

(10) Patent No.: US 11,808,802 B2
(45) Date of Patent: Nov. 7, 2023

(54) SYSTEM AND METHOD FOR MONITORING THE POLARIZATION AND CONDUCTION OF A THYRISTOR

(71) Applicant: ANDRITZ HYDRO CANADA INC., Pointe-Claire (CA)

(72) Inventors: Jean-Francois St-Roch, Richelieu (CA); Aurelien Carte, Chambly (CA); Quentin Bricard, Chambly (CA); Handy Fortin Blanchette, Montreal (CA)

(73) Assignee: ANDRITZ HYDRO CANADA INC., Pointe-Claire (CA)

( * ) Notice: Subject to any disclaimer, the term of this patent is extended or adjusted under 35 U.S.C. 154(b) by 218 days.

(21) Appl. No.: 17/500,110

(22) Filed: Oct. 13, 2021

(65) Prior Publication Data
US 2022/0113345 A1    Apr. 14, 2022

Related U.S. Application Data

(60) Provisional application No. 63/091,354, filed on Oct. 14, 2020.

(51) Int. Cl.
*G01R 31/26*    (2020.01)
*G01R 19/14*    (2006.01)
*H03K 17/72*    (2006.01)

(52) U.S. Cl.
CPC ........... *G01R 31/263* (2013.01); *G01R 19/14* (2013.01); *H03K 17/72* (2013.01)

(58) Field of Classification Search
CPC ...... G01R 31/263; G01R 19/14; H03K 17/72; H03K 17/18
(Continued)

(56) References Cited

U.S. PATENT DOCUMENTS

| | | | | |
|---|---|---|---|---|
| 3,646,398 A | * | 2/1972 | Kotos | H03K 17/0824 361/115 |
| 4,104,570 A | * | 8/1978 | Hamby | H02P 7/293 388/813 |

(Continued)

OTHER PUBLICATIONS

Canadian Application No. 3,134,341, Notice of Allowance dated May 18, 2023, 4 pages.

*Primary Examiner* — Christopher P McAndrew
(74) *Attorney, Agent, or Firm* — Kilpatrick Townsend & Stockton LLP

(57) ABSTRACT

A system for monitoring polarization and conduction of a thyristor includes a transformer configured to generate a secondary current from a triggering current waveform applied to a gate of the thyristor; a converter configured to convert the secondary current into a monitored voltage; a first hysteresis comparator configured to generate a first voltage pulse based on the monitored voltage when the triggering current waveform includes a first current pulse; a second hysteresis comparator configured to generate one or more second voltage pulses based on the monitored voltage when the triggering current waveform includes one or more second current pulses; a monitoring unit configured to receive the first and the one or more second voltage pulses, and determine whether the triggering current waveform satisfies pre-defined characteristics, and to determine whether a current flowing between the anode and cathode of the thyristor satisfies additional pre-defined characteristics.

20 Claims, 13 Drawing Sheets

(58) Field of Classification Search
USPC .................................................... 324/762.1
See application file for complete search history.

(56) References Cited

U.S. PATENT DOCUMENTS

| | | | | |
|---|---|---|---|---|
| 4,713,553 | A * | 12/1987 | Townsend | G01R 19/16552 |
| | | | | 307/64 |
| 5,668,465 | A * | 9/1997 | May | H02J 7/0031 |
| | | | | 320/DIG. 19 |
| 6,700,432 | B2 * | 3/2004 | Misdom | H03K 17/302 |
| | | | | 327/205 |
| 2001/0007252 | A1 * | 7/2001 | Ito | F02P 3/0554 |
| | | | | 123/630 |
| 2001/0009609 | A1 * | 7/2001 | Bradenbaugh | H05B 1/0283 |
| | | | | 392/447 |
| 2005/0259373 | A1 * | 11/2005 | Hoopes | H02H 3/207 |
| | | | | 361/90 |
| 2011/0103110 | A1 * | 5/2011 | Godridge | H02J 3/381 |
| | | | | 363/74 |

\* cited by examiner

SYSTEM AND METHOD FOR MONITORING THE POLARIZATION AND CONDUCTION OF A THYRISTOR

CROSS-REFERENCES TO RELATED APPLICATIONS

This application claims the benefit of U.S. Provisional Application No. 63/091,354 filed Oct. 14, 2020, the content of which is hereby incorporated herein by reference in its entirety.

TECHNICAL FIELD

The present disclosure relates to the field of thyristors. More specifically, the present disclosure relates to a system and method for monitoring the polarization and conduction of a thyristor.

BACKGROUND

Unless otherwise indicated herein, the materials described in this section are not prior art to the claims in this application and are not admitted to be prior art by inclusion in this section.

Thyristors are used in many industrial processes. For instance, thyristors are used to control the magnetization of a rotor of a synchronous machine. One exemplary application is the generation of electricity by the magnetized rotor (e.g., in the context of a dam generating hydroelectricity). In order to ensure the stability of the electricity supplied to an electrical network by the magnetized rotor, the magnetization of the rotor needs to be precisely controlled. A thyristor bridge provides this capability of precisely controlling the magnetization of the rotor.

A thyristor is an electronic component capable of supporting electrical currents with a high amperage or voltage. The thyristor includes an anode, a cathode, and a gate. When the gate is not polarized, no electrical current flows from the anode to the cathode. When the gate receives a triggering electrical current with adequate characteristics and simultaneously adequate conditions are met including a positive voltage being applied between the anode and the cathode, the thyristor starts conducting. The polarization of the gate with the appropriate circuit conditions, results in an electrical current flowing from the anode to the cathode.

The triggering electrical current is generated by control equipment, generally an electronic circuit, and usually consists of one or more pulses, each pulse having specific characteristics (e.g., duration, amplitude, shape of the pulse, etc.). If one or more pulses are not compliant with corresponding specific characteristics of the thyristor, the polarization of the thyristor is not adequate. One possible consequence is that no electrical current flows between the anode and the cathode of the thyristor. Another possible consequence is that the gate can be destroyed by overheating.

Therefore, there is a need for a system and method for monitoring the polarization and conduction of a thyristor.

SUMMARY

Systems and methods for monitoring polarization and conduction of a thyristor are provided.

According to various aspects there is provided a system. In some aspects, the system may include: a thyristor; a current transformer configured to generate a secondary electrical current from a triggering electrical current waveform, wherein the triggering electrical current waveform is applied to a gate of the thyristor; a current to voltage converter configured to convert the secondary electrical current into a monitored voltage; a first hysteresis comparator configured to receive the monitored voltage and to generate a first voltage pulse corresponding to a first current pulse having a first amplitude of the triggering electrical current waveform, wherein a duration of the first voltage pulse corresponds to a duration of the first current pulse; a second hysteresis comparator configured to receive the monitored voltage and to generate one or more second voltage pulses corresponding to one or more second current pulses having a second amplitude of the triggering electrical current waveform, wherein a duration of each of the one or more second voltage pulses corresponds to a duration of each of the one or more second current pulses, and wherein the first amplitude is higher than the second amplitude; and a monitoring unit configured to receive the first voltage pulse from the first hysteresis comparator and the one or more second voltage pulses from the second hysteresis comparator, wherein the monitoring unit is further configured to determine based on the first voltage pulse and the one or more second voltage pulses whether the triggering electrical current waveform is compliant with pre-defined characteristics.

According to various aspects there is provided a method for monitoring polarization and conduction of a thyristor. In some aspects, the method may include: generating, by a current transformer, a secondary electrical current from a triggering electrical current waveform, wherein the triggering electrical current waveform is applied to a gate of the thyristor; converting, by a current to voltage converter, the secondary electrical current into a monitored voltage; receiving, by a first hysteresis comparator, the monitored voltage; generating, by the first hysteresis comparator, a first voltage pulse corresponding to a first current pulse having a first amplitude of the triggering electrical current waveform, wherein a duration of the first voltage pulse corresponds to a duration of the first current pulse; receiving, by a second hysteresis comparator, the monitored voltage; generating, by the second hysteresis comparator, one or more second voltage pulses corresponding to one or more second current pulses having a second amplitude of the triggering electrical current waveform, wherein a duration of each of the one or more second voltage pulse corresponds to a duration of each of the one or more second current pulses, the first amplitude being higher than the second amplitude; receiving, by a monitoring unit, the first voltage pulse from the first hysteresis comparator and the one or more second voltage pulses from the second hysteresis comparator; and executing, by the monitoring unit a monitoring algorithm for determining based on the first voltage pulse and the one or more second voltage pulses whether the triggering electrical current waveform is compliant with pre-defined characteristics.

According to various aspects there is provided a system for monitoring polarization and conduction of a thyristor. In some aspects, the system may include: a first hysteresis comparator configured to generate a first voltage pulse corresponding to a first current pulse having a first amplitude and duration of a triggering electrical current waveform applied to a gate of the thyristor; a second hysteresis comparator configured to generate at least one second voltage pulse corresponding to at least one second current pulse having a second amplitude and duration of the triggering electrical current waveform applied to the gate of the thyristor, wherein the first amplitude is higher than the second amplitude; and a monitoring unit configured to determine based on the first voltage pulse and the at least one second voltage pulse whether the triggering electrical current waveform is compliant with pre-defined characteristics.

BRIEF DESCRIPTION OF THE DRAWINGS

Aspects and features of the various embodiments will be more apparent by describing examples with reference to the accompanying drawings, in which.

DETAILED DESCRIPTION

While certain embodiments are described, these embodiments are presented by way of example only, and are not intended to limit the scope of protection. The apparatuses, methods, and systems described herein may be embodied in a variety of other forms. Furthermore, various omissions, substitutions, and changes in the form of the example methods and systems described herein may be made without departing from the scope of protection.

Various aspects of the present disclosure generally address one or more of the problems related to the monitoring of operating conditions of a thyristor, and more specifically to determine if the thyristor has been properly triggered by a polarization current and has reacted adequately to the polarization current.

Figure 1A:
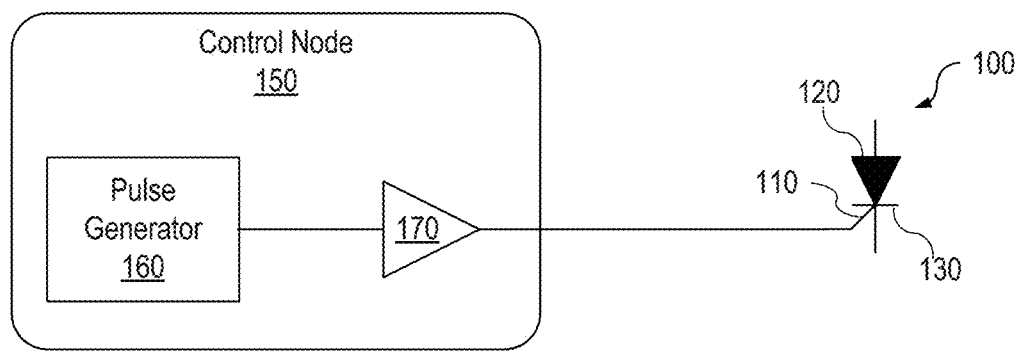
FIGS. 1A and 1B are block diagrams illustrating examples of polarization of a thyristor by a triggering electrical current according to some aspects of the present disclosure.
Figure 1B:
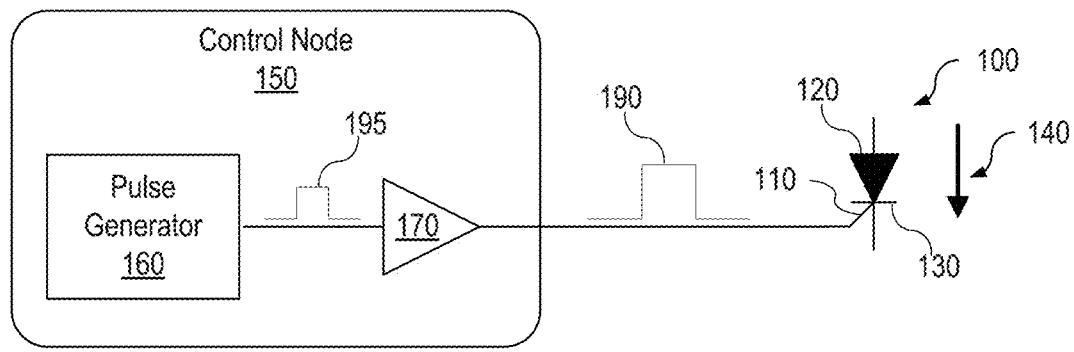

FIGS. 1A and 1B are block diagrams illustrating examples of polarization of a thyristor by a triggering electrical current according to some aspects of the present disclosure. Referring concurrently to FIGS. 1A and 1B, a thyristor 100 and a control node 150 are represented. As mentioned previously, the thyristor 100 is a semiconductor element well known in the art. The thyristor 100 includes a gate 110, an anode 120 and a cathode 130. As illustrated in FIG. 1A, when the gate 110 is not triggered by a triggering electrical current, no electrical current flows between the anode 120 and the cathode 130. As illustrated in FIG. 1B, when the gate 110 is triggered by the triggering electrical current 190 and a positive voltage is applied between the anode 120 and the cathode 130, an electrical current 140 flows between the anode 120 and the cathode 130.

The control node 150 is configured to generate the triggering electrical current 190. The control node 150 comprises a pulse generator 160 for generating a triggering electrical current 195. An amplitude of the triggering electrical current 195 is generally too low for adequately polarizing the gate 110 of the thyristor 100. Thus, the control node 150 comprises an amplifier 170 for amplifying the triggering electrical current 195 into the triggering electrical current 190. The amplitude of the triggering electrical current 190 is adapted for polarizing the gate 110 of the thyristor 100. The amplifier 170 also provides galvanic isolation, to protect the pulse generator 160. The pulse generator 160 and the amplifier 170 are components well known in the art, and will not be further detailed. Furthermore, the embodiment of the control node 150 represented in FIGS. 1A and 1B is for illustration purposes only. The control node 150 may include different components, additional components, etc.

Figure 2A:
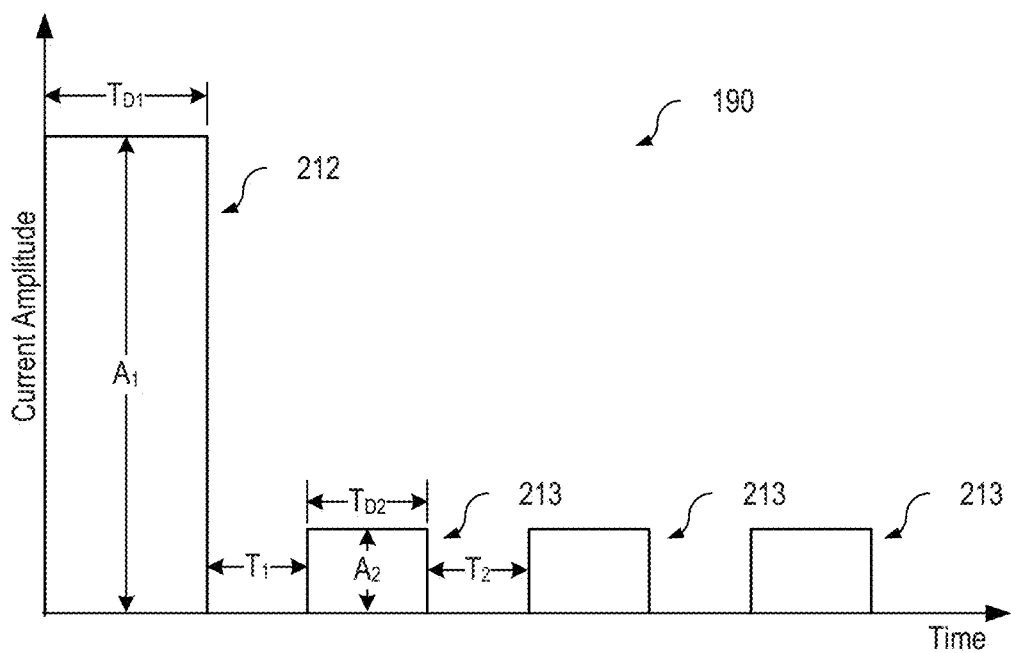
FIG. 2A is a diagram illustrating an example of the triggering electrical current waveform shown in FIG. 1B according to some aspects of the present disclosure.

Reference is now made concurrently to FIGS. 1A, 1B, and 2A. FIG. 2A is a diagram illustrating an example of the triggering electrical current waveform 190 shown in FIG. 1B according to some aspects of the present disclosure. Embodiments according to the present disclosure may be based on a triggering electrical current waveform 190 comprising a high current pulse 212 followed by N (e.g., 3 or another number) low current pulses 213a-213c, where N is an integer value greater or equal than 1.

The high current pulse 212 has an amplitude A1 and a duration TD1. Each low current pulse 213a-213c has an amplitude A2 and a duration TD2. As illustrated in FIG. 2A, the amplitude A1 of the high current pulse 212 may be higher than the amplitude A2 of the low current pulses 213a-213c. In some implementations, the duration TD1 may be equal to the duration TD2. In some implementations, the duration TD1 may be different from the duration TD2. For example, the duration TD1 may be longer or shorter than the duration TD2. The high current pulse 212 may be separated from the low current pulse 213a by a time interval T1.

Two consecutive low current pulses 213a-213c may be separated by a time interval T2. In some implementations, the time interval T1 may be equal to the time interval T2. In some implementations, the time interval T1 may be different from the time interval T2. For example, the time interval T1 may be longer or shorter than the time interval T2. In some implementations, the amplitude A1 of the high current pulse 212 may be 3 Amperes (A) and the amplitude A2 of the low current pulses 213a-213c may be 1 A. The duration TD1 of the high current pulse 212 and the duration TD2 of the low current pulses 213a-213c may both the equal to 25 microseconds or another duration.

The high current pulse 212 is generally sufficient to trigger the polarization of the gate 110. The series of N low current pulses 213a-213c may ensure that the polarization is maintained, thereby providing a better reliability of the operations of the thyristor 100.

Figure 2B:
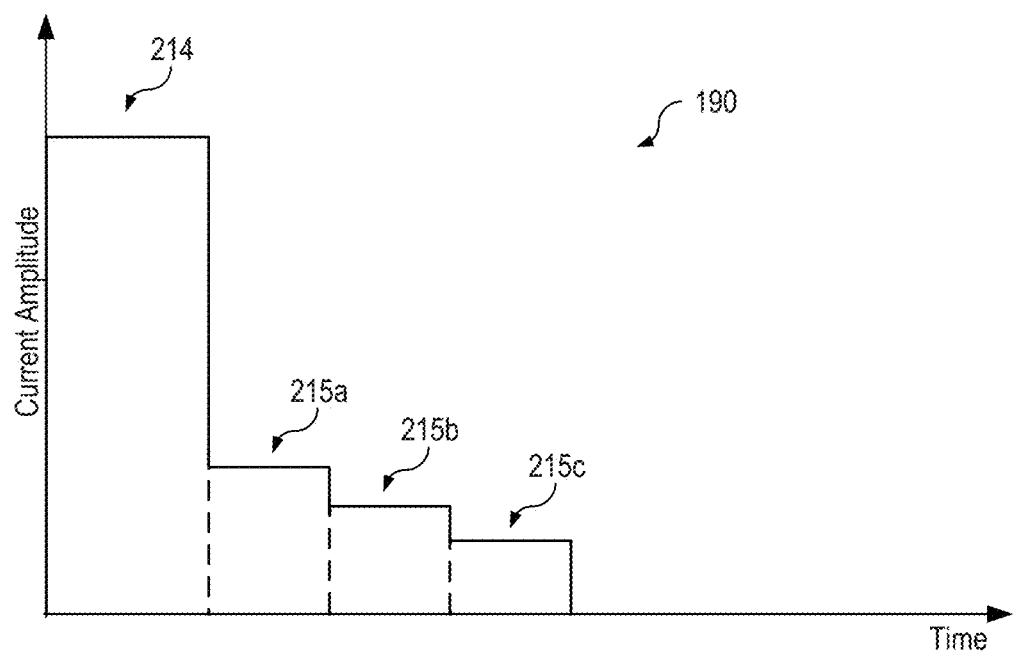
FIG. 2B is a diagram illustrating an example of alternative characteristics of the triggering electrical current waveform shown in FIG. 1B according to some aspects of the present disclosure.

The triggering electrical current waveform 190 may have a different shape than the one illustrated in FIG. 2A. For example, FIG. 2B is a diagram illustrating an example of alternative characteristics of the triggering electrical current waveform shown in FIG. 1B according to some aspects of the present disclosure. FIG. 2B illustrates a triggering electrical current waveform 190 having the high current pulse 214 followed by the three low current pulses 213. However, the amplitude of each of the three low current pulses 215a-215c is different and decreases slightly from the first low current pulse to the third low current pulse. Furthermore, there is no time interval between the current pulses.

Figure 3:
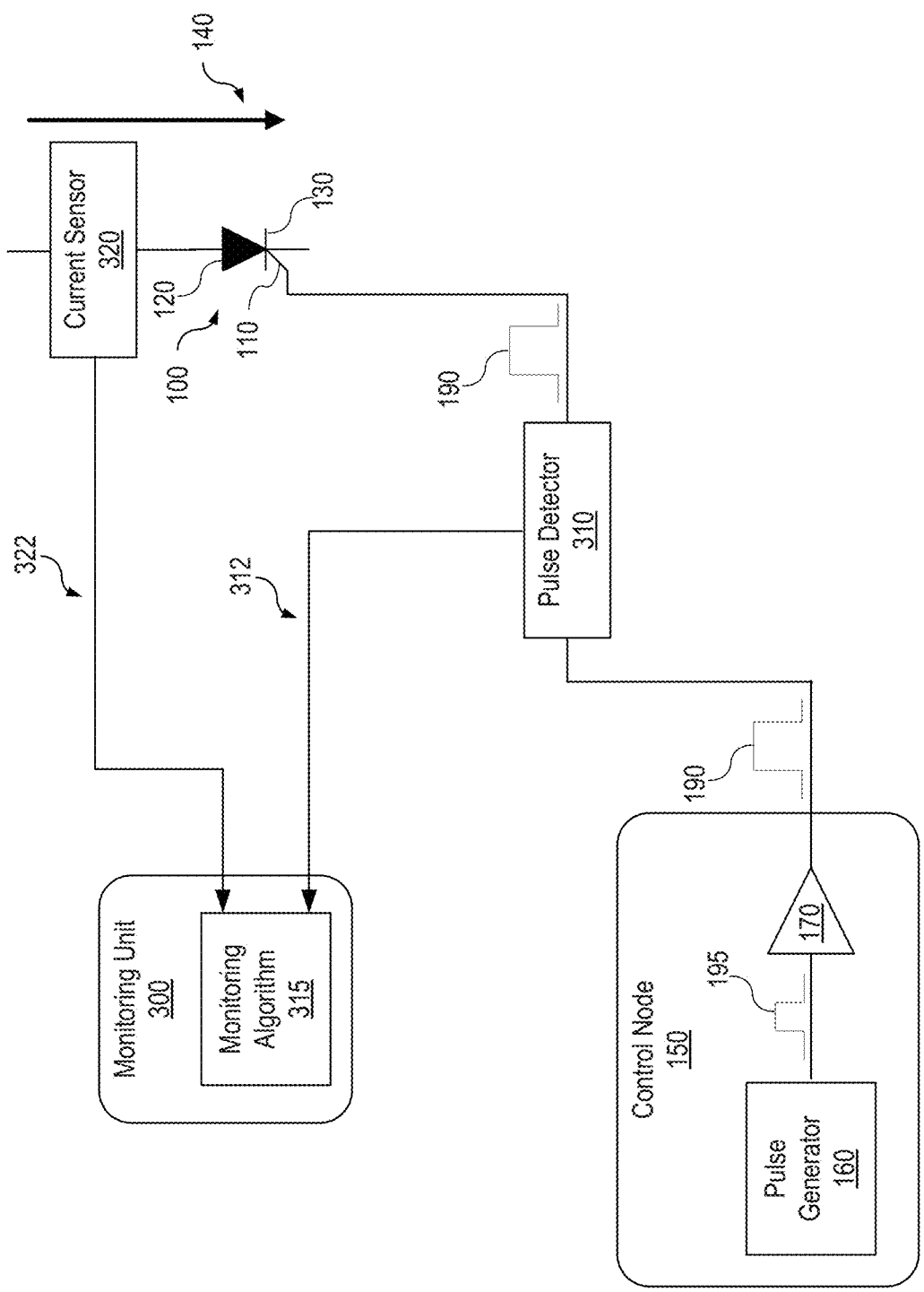
FIG. 3 is a simplified block diagram illustrating an example of a system for monitoring the polarization and conduction of the thyristor shown in FIGS. 1A and 1B according to some aspects of the present disclosure.

Reference is now made concurrently to FIGS. 1A, 1B, 2A and 3. FIG. 3 is a simplified block diagram illustrating an example of a system for monitoring the polarization and conduction of the thyristor shown in FIGS. 1A and 1B according to some aspects of the present disclosure. Referring to FIG. 3, the monitoring unit 300 may be configured to monitor the operating conditions of the thyristor 100 to detect any malfunctions of the thyristor 100 caused by an inadequate triggering electrical current waveform 190 or by a thyristor failure.

The thyristor 100 and the control node 150 shown in FIG. 3 correspond to the thyristor 100 and the control node 150 shown in FIGS. 1A and 1B. The triggering electrical current waveform 190 shown in FIG. 3 corresponds to the triggering electrical current waveform 190 shown in FIG. 1B, and may have the characteristics represented in FIGS. 2A or 2B.

The monitoring unit 300 is configured to receive signals from a pulse detector 310 and a current sensor 320. More specifically, the pulse detector 310 may be configured to extract fundamental characteristics (e.g., amplitude, duration, timing, etc.) of the triggering electrical current waveform 190 and transmit the characteristics to the monitoring unit 300 via an output signal 312. The current sensor 320 may be configured to determine whether, upon sensing a triggering electrical current waveform 190 having adequate characteristics, the gate 110 of the thyristor 100 is adequately polarized to enable the electrical current 140 to flow between the anode 120 and the cathode 130 of the thyristor 100. The current sensor 320 may also be configured to extract characteristics of the primary electrical current 140, for example, but not limited to, current frequency, average current amplitude, maximum current amplitude, wave shape of the current, etc. The current sensor 320 may be configured to transmit the characteristics to the monitoring unit 300 via an output signal 322 having an electrical current proportional to the primary electrical current 140.

The monitoring unit 300 executes a monitoring algorithm 315, which processes the signals received from the pulse detector 310 and the current sensor 320, to determine whether the thyristor 100 is operating properly. The pulse detector 310 may operate independently of the current sensor 320. The monitoring algorithm 315 executed by the monitoring unit 300 may process the outputs of the pulse detector 310 and the outputs of the current sensor 320. In some implementations, the monitoring algorithm 315 may be configured to process only the outputs of the pulse detector 310 or only the outputs of the current sensor 320.

Figure 4:
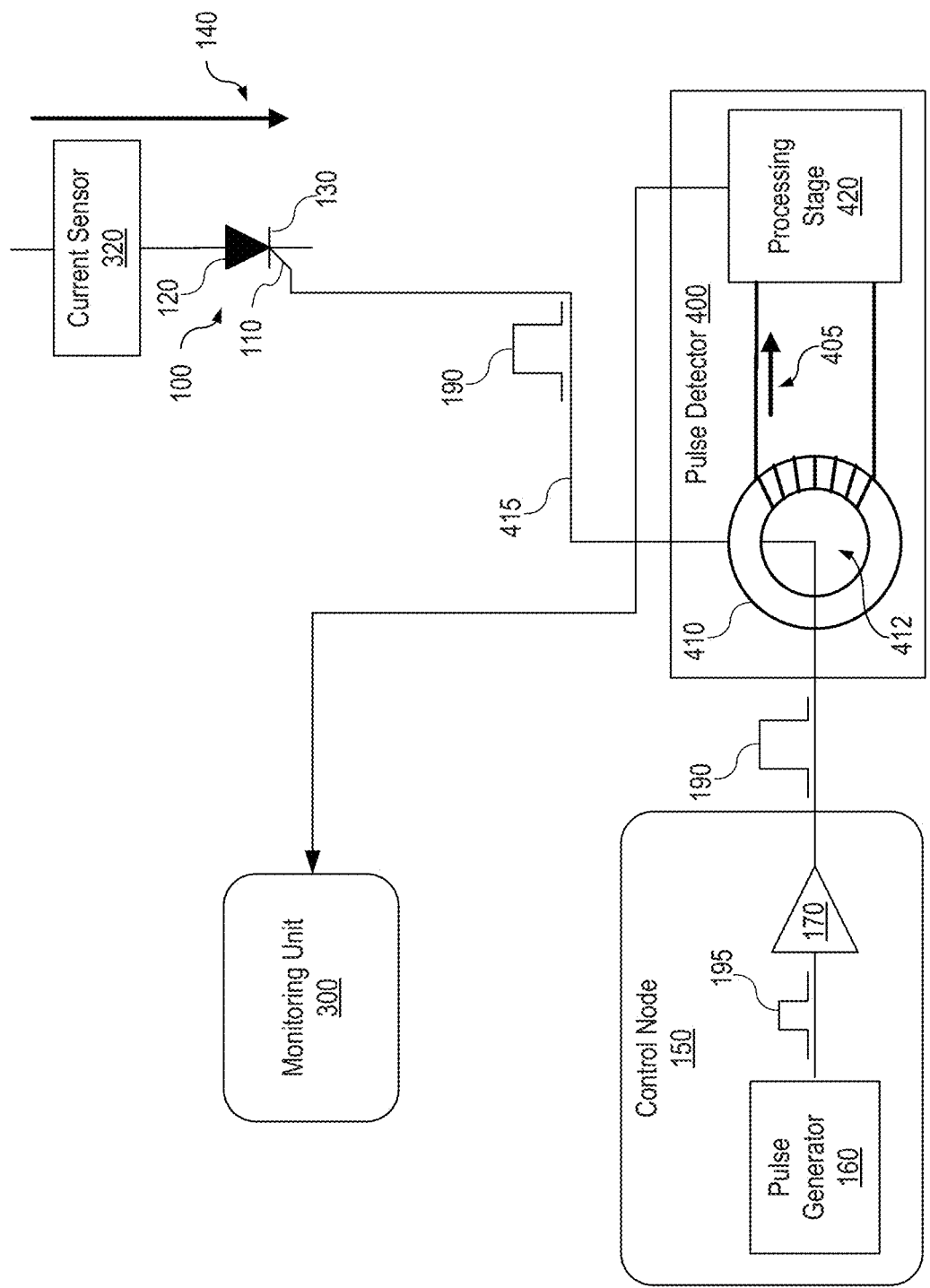
FIG. 4 is a simplified block diagram illustrating an example of a pulse detector shown in FIG. 3 according to some aspects of the present disclosure.

Reference is now made concurrently to FIGS. 2A, 4, 5, 6, and 7. FIG. 4 is a simplified block diagram illustrating an example of a pulse detector shown in FIG. 3 according to some aspects of the present disclosure. The pulse detector 400 may include a current transformer 410 and a processing stage 420. The pulse detector 400 may be, for example, the pulse detector 310 shown in FIG. 3.

The current transformer 410 may generate a secondary electrical current 405 from an electrical current flowing through primary windings of the current transformer 410. In the present disclosure, the electrical current may be the triggering electrical current waveform 190. The secondary electrical current 405 may be proportional to the triggering electrical current waveform 190. The secondary electrical current 405 is processed by the processing stage 420, to determine amplitude, duration, and timing characteristics of the triggering electrical current waveform 190 without perturbing the triggering electrical current waveform 190.

Figure 5:
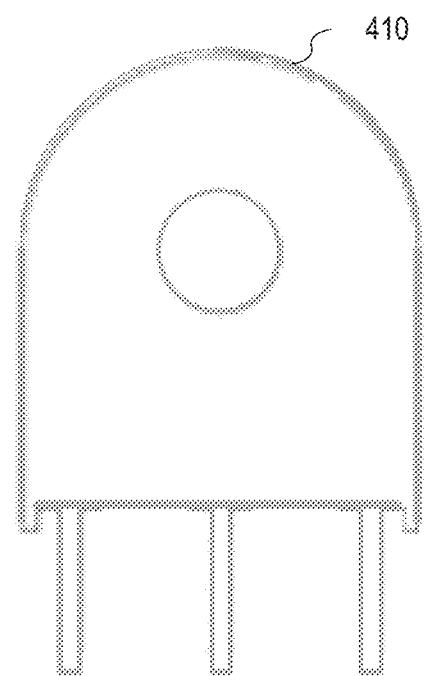
FIG. 5 is an illustration of an example of a current transformer that may be included in the pulse detector shown in FIG. 4 according to some aspects of the present disclosure.

According to some aspects of the present disclosure, the current transformer 410 may be a high frequency current transformer configured to provide four kilovolts (kV) electrical isolation. The isolation is provided by avoiding electrical contact between the current transformer 410 and an electrical conductor 415 carrying the triggering electrical current waveform 190 from the control node 150 to the gate 110 of the thyristor 100. The electrical conductor 415 may be positioned in the center of the window 412 of the current transformer 410. In order to improve the electrical isolation, insulating epoxy can be added when the electrical conductor 415 is inserted in the window 412 of the current transformer 410. FIG. 5 is an illustration of an example of a current transformer 410 that may be included in the pulse detector 400 shown in FIG. 4 according to some aspects of the present disclosure.

Figure 6:
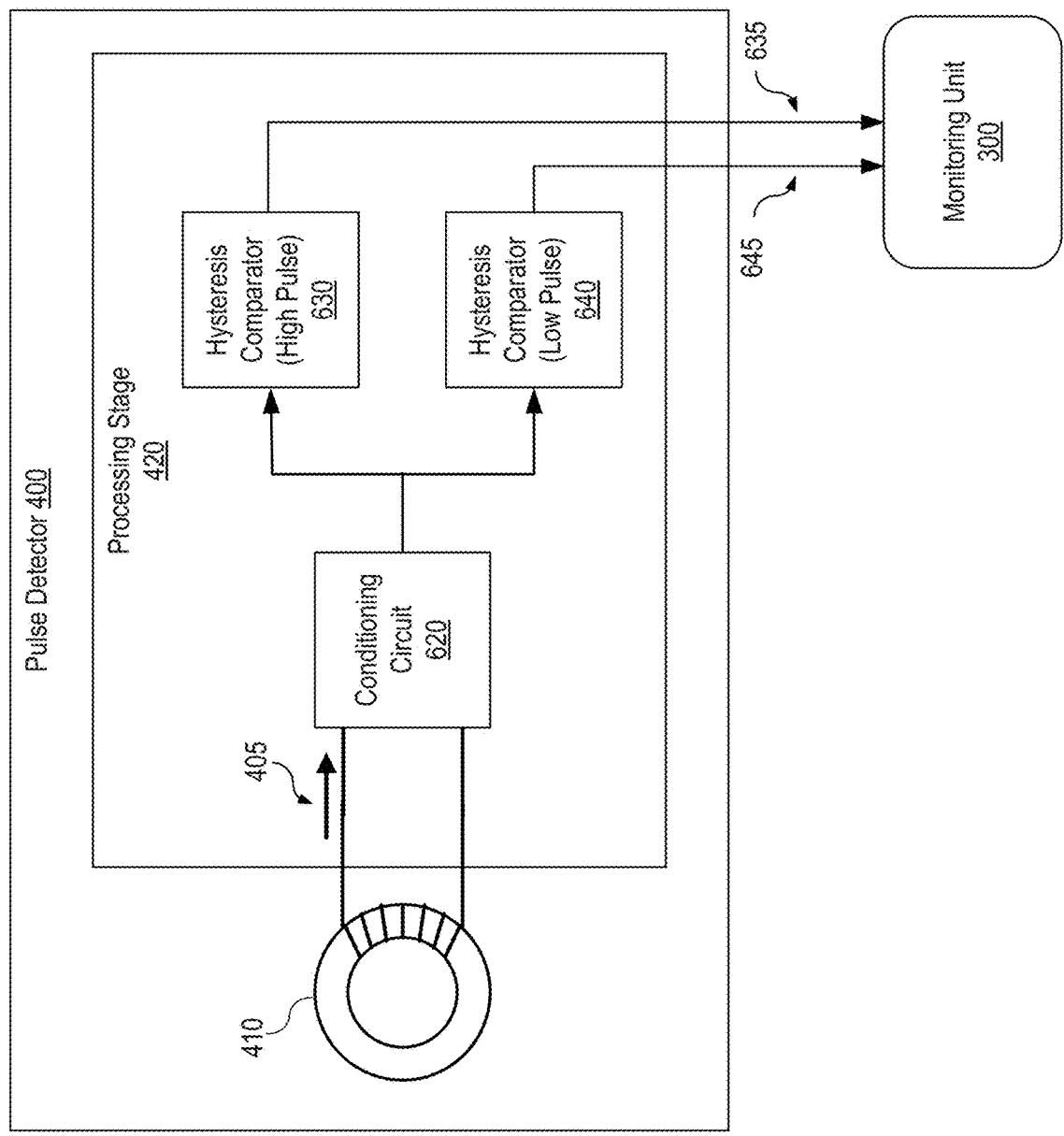
FIG. 6 is a simplified block diagram illustrating an example of the pulse detector shown in FIG. 3 according to some aspects of the present disclosure.

FIG. 6 is a simplified block diagram illustrating an example of the processing stage 420 of the pulse detector 400 shown in FIG. 3 according to some aspects of the present disclosure. Referring to FIG. 6, the processing stage 420 may include a conditioning circuit 620 configured to pre-process the secondary current 405 generated by the current transformer 410 as further described below. The processing stage 420 may further include a first hysteresis comparator 630 configured to process an output of the conditioning circuit 620. The first hysteresis comparator 630 may be configured to monitor characteristics of the high current pulse 212 of the triggering electrical current waveform 190 shown, for example, in FIG. 2A. A voltage pulse 635 may be generated by the first hysteresis comparator 630 and transmitted to the monitoring unit 300 when an occurrence of the high current pulse 212 in the triggering electrical current waveform 190 is detected by the first hysteresis comparator 630.

The processing stage 420 may further include a second hysteresis comparator 640 configured to process the output of the conditioning circuit 620. The second hysteresis comparator 640 may be configured to monitor characteristics of the low current pulses 213a-213c of the triggering electrical current waveform 190 shown, for example, in FIG. 2A. A voltage pulse 645 may be generated by the second hysteresis comparator 640 and transmitted to the monitoring unit 300 when an occurrence of the low current pulse 213a-213c in the triggering electrical current waveform 190 is detected by the second hysteresis comparator 640. A voltage pulse may also be generated by the second hysteresis comparator 640 and transmitted to the monitoring unit 300 upon occurrence of the high current pulse 212 in the triggering electrical current waveform 190. Since the second hysteresis comparator 640 may be configured to detect the low current pulses 213a-213c, which have a lower amplitude (see A2 in FIG. 2A) than the amplitude (see A1 in FIG. 2A) of the high current pulse 212, the second hysteresis comparator 640 also detects the high current pulse 212.

Figure 7:
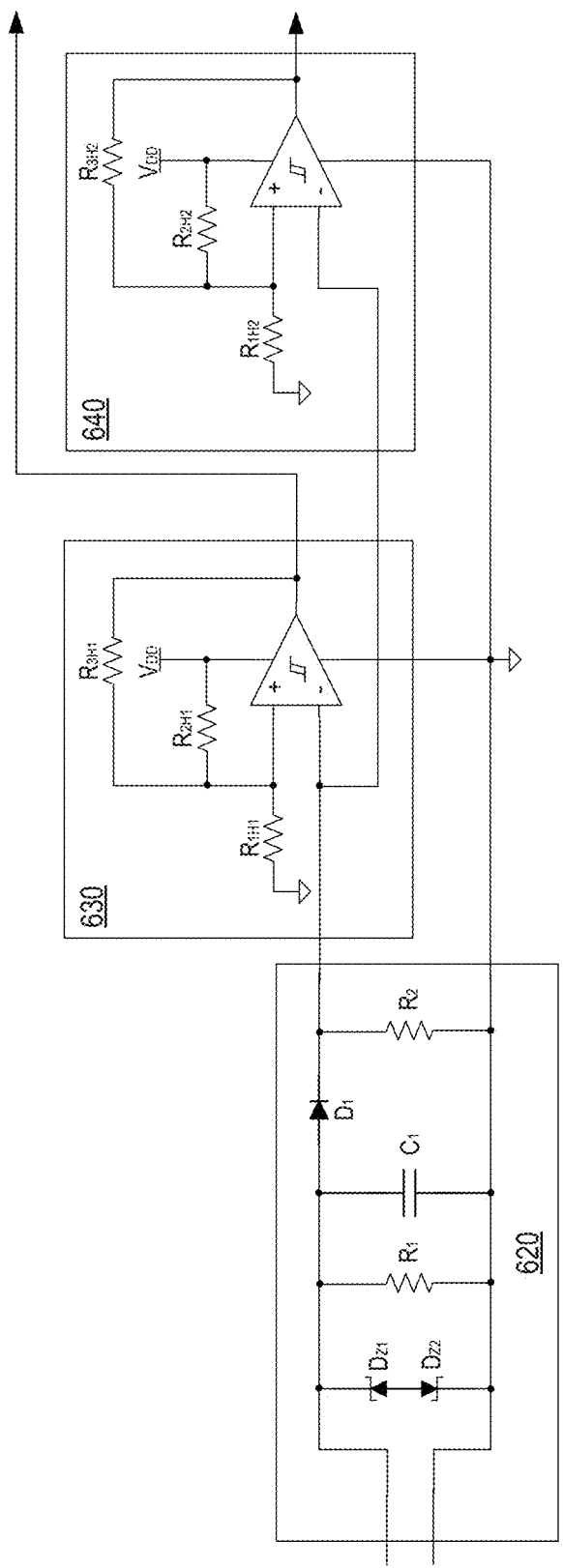
FIG. 7 is a simplified schematic diagram illustrating an example of the conditioning circuit, the first hysteresis comparator, and the second hysteresis comparator of the processing stage shown in FIG. 6 according to some aspects of the present disclosure.

FIG. 7 is a simplified schematic diagram illustrating an example of the conditioning circuit 620, the first hysteresis comparator 630, and the second hysteresis comparator 640 of the processing stage 420 shown in FIG. 6 according to some aspects of the present disclosure. According to some aspects of the present disclosure, the high current pulse 212 and the low current pulse(s) 213 illustrated in FIGS. 2A and/or 2B may be recovered without distortions. According to other aspects of the present disclosure, electronic noise that may be generated by electric/electronic equipment (e.g., the thyristor 100 illustrated in FIG. 3 and/or other equipment) that may be collocated with the pulse detector 400 may be minimized. The conditioning circuit, the first hysteresis comparator, and the second hysteresis comparator are further described below.

Figure 8A:
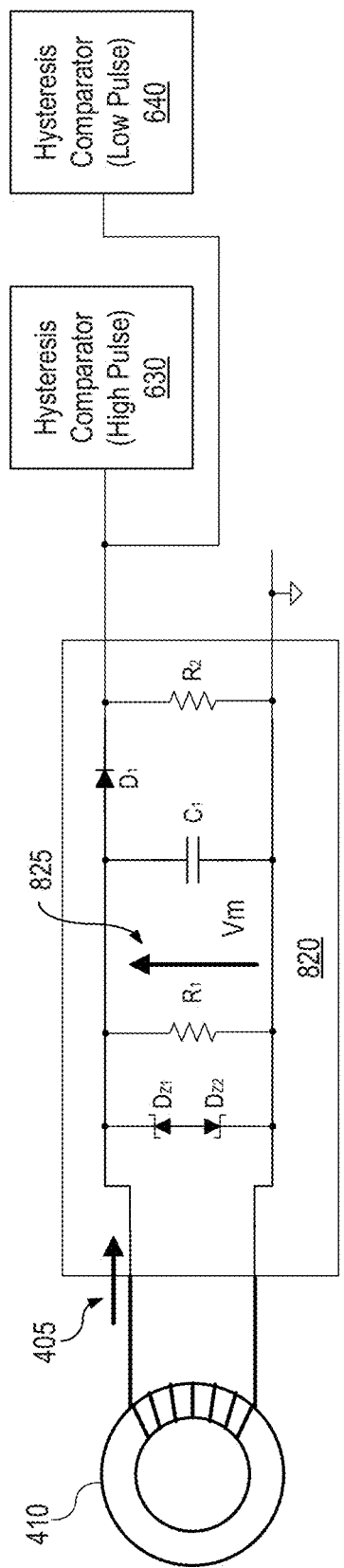
FIGS. 8A is a simplified schematic diagram illustrating an example of the conditioning circuit illustrated in FIG. 7 according to some aspects of the present disclosure.

Reference is now made concurrently to FIGS. 2A, 4, 7, and 8A. FIG. 8A is a simplified schematic diagram illustrating an example of the conditioning circuit illustrated in FIG. 7 according to some aspects of the present disclosure. Referring to FIG. 8A, the conditioning circuit 820 may be the conditioning circuit 620 illustrated in FIG. 7. According to some aspects of the present disclosure, the conditioning circuit 820 may be configured to perform a current to voltage conversion implemented by a resistor R1, a low-pass filter implemented by a capacitor C1, and a negative voltage clipper implemented by a diode D1.

The conditioning circuit 820 may include the resistor R1 configured to convert the secondary current 405 generated by the current transformer 410 into a monitored voltage Vm 825. The value of the resistor R1 is low and is dependent on the transformer winding ratio of the current transformer 410. For example, the value of the resistor R1 may be 50 ohms ($\Omega$) for a transformer ratio R=1:50 (e.g., the current transformer 410 generates a secondary electrical current 405 having an amplitude of 1 A for a triggering electrical current waveform 190 having an amplitude of 50 A). Similarly, the value of the resistor R1 may be 100 $\Omega$ for a transformer ratio R=1:100 (e.g., the current transformer 410 generates a secondary electrical current 405 having an amplitude of 0.01 A for a triggering electrical current waveform 190 having an amplitude of 1 A).

Figure 9A:
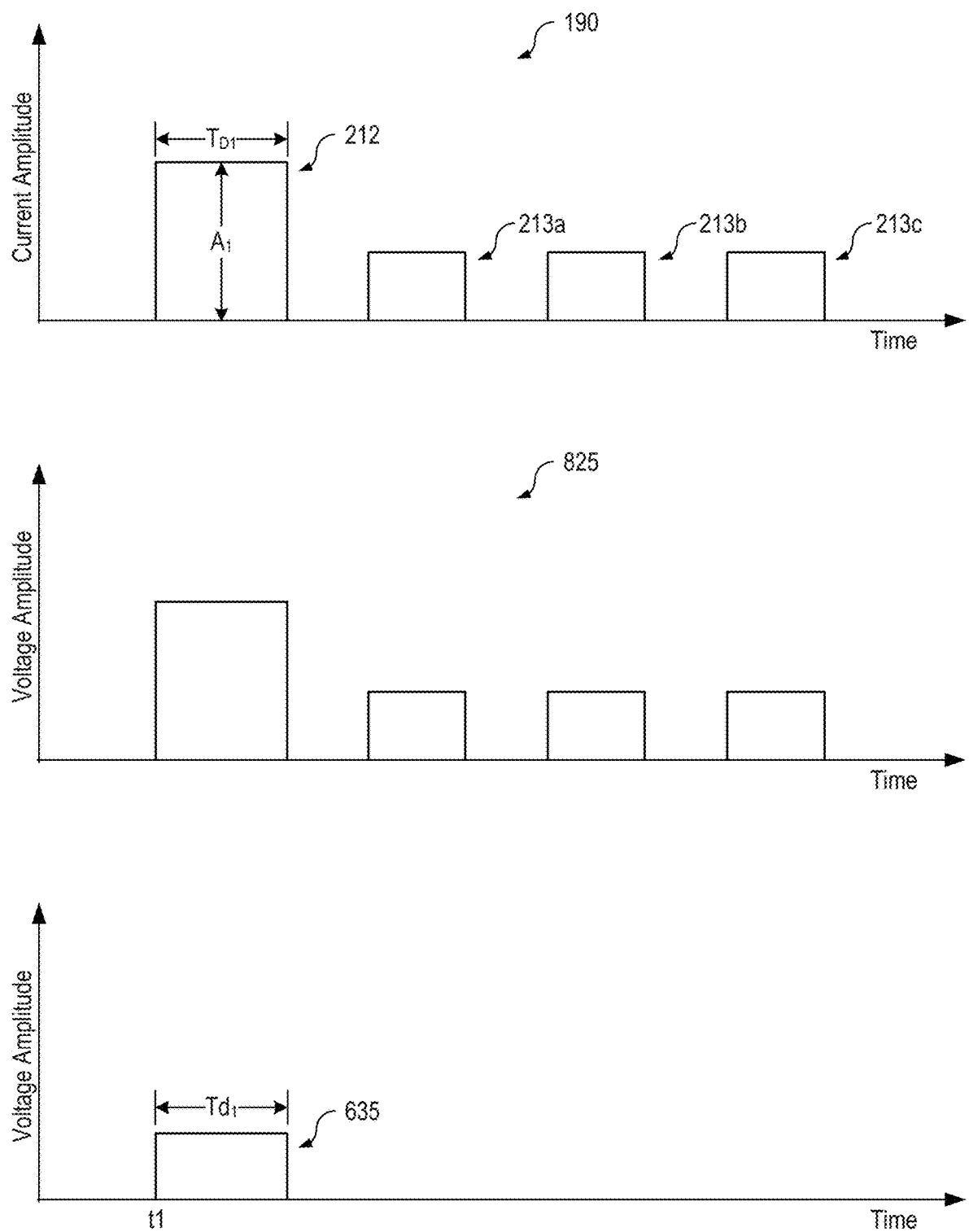
FIGS. 9A and 9B are examples of the triggering electrical current waveform shown in FIG. 2 and voltage pulses detecting the characteristics of the triggering electrical current waveform according to some aspects of the present disclosure.
Figure 9B:
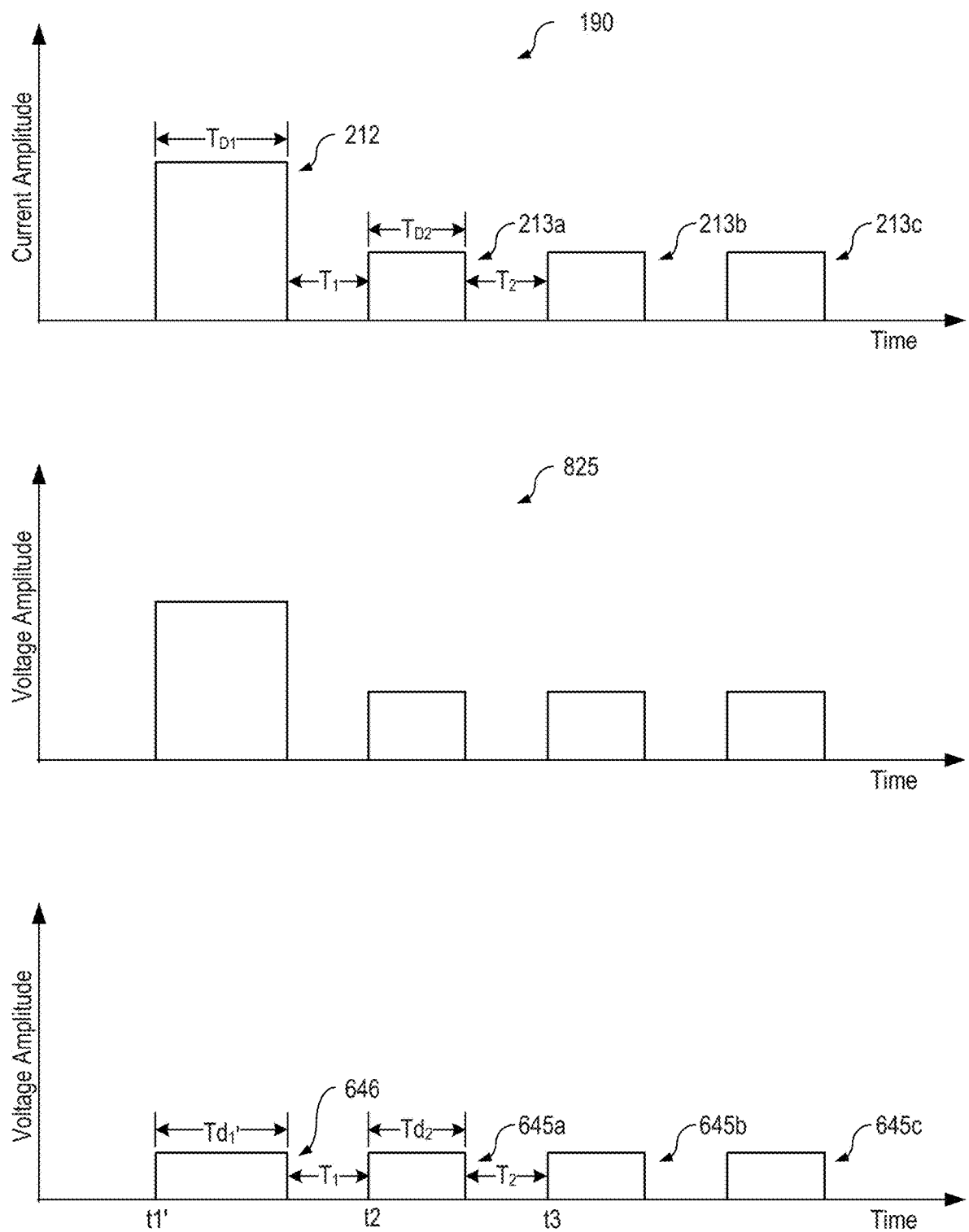

The relationship between the value of R1 and the current transformer winding ratio may provide a resolution of 1 volt of the monitored voltage Vm 825 applied across the resistor R1 to 1 amp of the triggering electrical current waveform 190 measured by the current transformer 410. Furthermore, as illustrated in FIGS. 9A and 9B, the monitored voltage Vm 825 is a mirror of the triggering electrical current waveform 190. That is, the monitored voltage Vm 825 may have a corresponding voltage pulse for each high current pulse 212 and each low current pulse 213 of the triggering electrical current waveform 190.

The conditioning circuit 820 may further include two back-to-back series-connected Zener diodes Dz1 and Dz2 connected in parallel to the resistor R1. The Zener diodes may be located at the input of the conditioning circuit 820 between the resistor R1 and the output of the current transformer 410. The Zener diodes protect against voltage peaks at the output of the current transformer 410 that can be applied to the subsequent electronic circuitry (e.g., the first hysteresis comparator 630, the second hysteresis comparator 640, etc.) if a problem occurs with the resistor R1 (e.g., R1 is defective, not properly mounted on the electronic circuit, the value is not adequate, etc.).

The conditioning circuit 820 may further include the capacitor C1 connected in parallel to the resistor R1. The capacitor C1 may filter high frequency noise generated by electric/electronic equipment (e.g., the thyristor 100 shown in FIG. 4 and/or other equipment) collocated with the pulse detector 400.

The value of the capacitor C1 may be selected to be high enough to reduce the high frequency noise by providing a low impedance to ground for frequencies higher than approximately 500 kHz and low enough to not significantly slow down a rise time of the monitored voltage Vm 825 across the resistor R1. If the rise time of the monitored voltage Vm 825 is too slow, the first and second hysteresis comparators 630, 640 may be unable to accurately measure the durations TD1 and TD2 of the high current pulse 212 and the low current pulses 213, respectively, of the triggering electrical current waveform 190 (see FIG. 2).

For example, the value of the capacitor C1 may be set to 5.6 nanofarad (nF) to provide an impedance of approximately 28 $\Omega$ at a frequency of 1 megaherzt (MHz). With R1 set at 50 $\Omega$, the rise time may be obtained after a charging time equal to 5 time constants (T), where $T=R1 \times C1 = 50 \times 5.6 \times 10^{-9} = 280$ nanoseconds (ns).

The capacitor C1 should be implemented such that the equivalent series inductance (ESL) of the capacitor C1 is as low as possible. Furthermore, if the value of the capacitor C1 is not properly selected and/or if a circuit board implementing the conditioning circuit 820 comprises large surfaces, the self-resonance of the capacitor C1 may occur at a frequency that is too low to properly attenuate the high frequency noise.

The conditioning circuit 820 may further include the diode D1 configured to cancel negative components of the monitored voltage Vm 825. For some implementations of the current transformer 410, the monitored voltage Vm 825 may always positive. However, for other implementations of the current transformer 410, the monitored voltage Vm 825 may take a low negative value. Thus, the diode D1 prevents the negative voltage components from being applied to the inputs of the first and second hysteresis comparators 630, 640, thereby protecting the hysteresis comparators from being damaged. The diode D1 may be a fast recovery diode.

The conditioning circuit 820 may further include a resistor R2 connected at the output of the conditioning circuit 620. The resistor R2 may reduce an offset voltage of the hysteresis comparators 630, 640 generated by input bias currents of the hysteresis comparators. The offset voltage can cause unwanted changes in the tripping points of the hysteresis comparators. Since the input bias current is present on both inputs of the comparator 632 of the first hysteresis comparator 630 illustrated in FIG. 8B, the value of the resistor R2 may be set to be equivalent to a parallel combination of the resistors R1H1, R2H1 and R3H1 (see FIG. 8B) of the first hysteresis comparator 630 in order to minimize the offset voltage of the first hysteresis comparator 630.

Additionally, the resistor R2 can prevent an input bias current of the comparator from flowing in the capacitive junction of the diode D1 when the diode D1 is reverse biased. The input bias current can load the capacitive junction of the diode D1 which in turn can raise the voltage applied to a terminal (e.g., the negative terminal) of the comparator 632 (see FIG. 8B) connected to the diode D1.

For example, even if no triggering electrical current waveform 190 is generated over a period of time, the output of the comparator 632 may still change state as a result of the input bias current raising the voltage applied to the terminal of the comparator 632 connected to the diode D1.

Figure 8B:
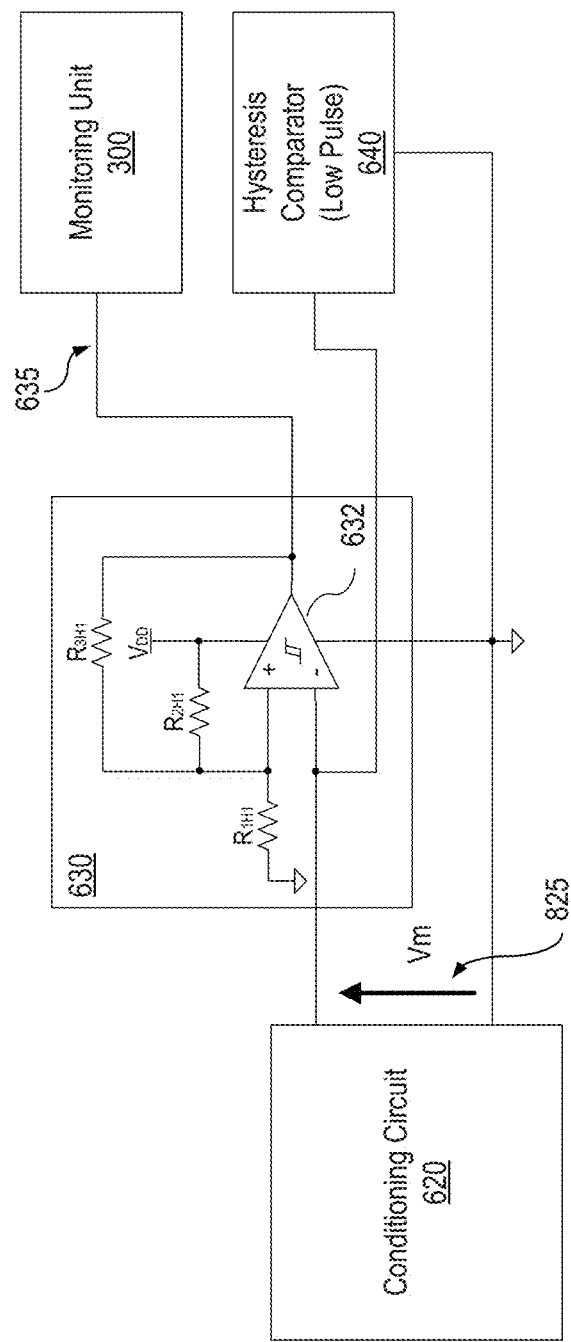
FIG. 8B is a simplified schematic diagram illustrating an example of the first hysteresis comparator illustrated in FIG. 7 according to some aspects of the present disclosure.
Figure 8C:
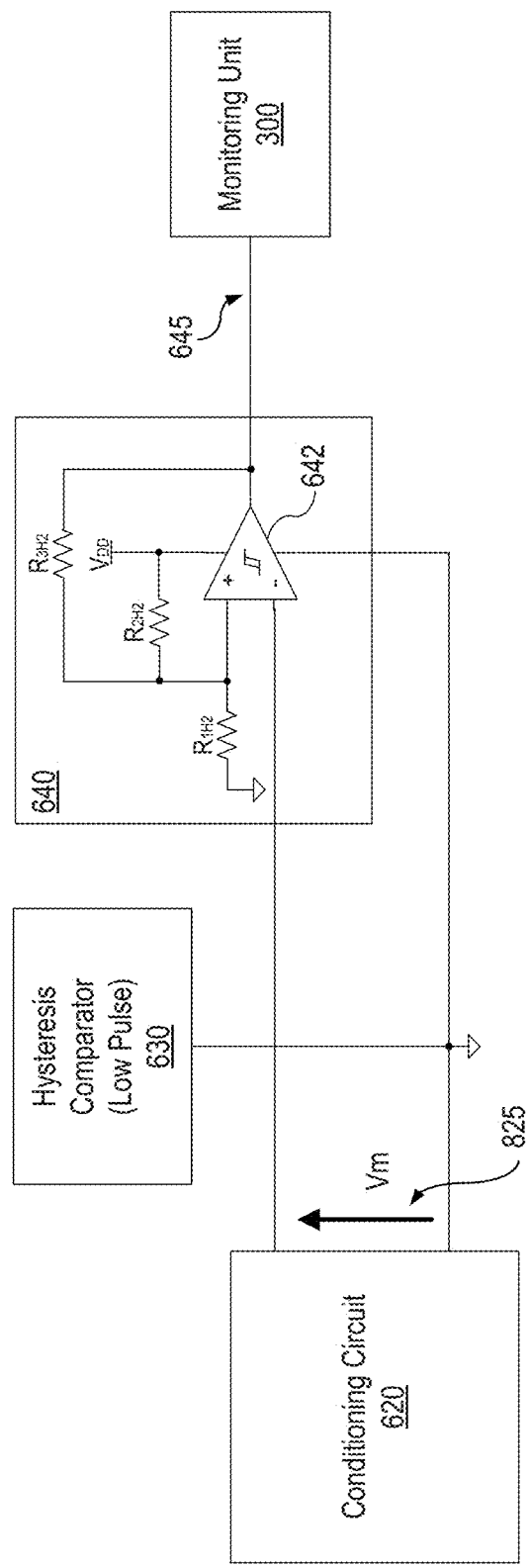
FIG. 8C is a simplified schematic diagram illustrating an example of the second hysteresis comparators illustrated in FIG. 7 according to some aspects of the present disclosure.

Reference is now made concurrently to FIGS. 2A, 7, 8B, and 8C. FIG. 8B is a simplified schematic diagram illustrating an example of the first hysteresis comparator 630 (high pulse) illustrated in FIG. 7 according to some aspects of the present disclosure. FIG. 8C is a simplified schematic diagram illustrating an example of the second hysteresis comparator 640 (low pulse) illustrated in FIG. 7 according to some aspects of the present disclosure. Hysteresis comparators 630, 640 may be used instead of simple comparators without hysteresis to prevent small variations around the respective nominal amplitudes A1 and A2 of the high current pulse 212 and the low current pulse 213, respectively, caused by high-frequency noise from affecting the detection of an occurrence of the high and low current pulses 212 and 213.

The hysteresis comparators 630 and 640 may have the same design and may be powered by a supply voltage $V_{DD}$. The first hysteresis comparator 630 may include a comparator 632 and a set of resistors R1H1, R2H1, R3H1. The second hysteresis comparator 640 may include a comparator 642 and a set of resistors R1H2, R2H2, R3H2. The comparators 632 and 642 may be implemented, for example, by a high-gain differential amplifier or other amplifier. Each of the hysteresis comparators 630, 640 may be configured to detect high current pulses and low current pulses of the triggering electrical current waveform 190 as determined by the values of their respective sets of resistors.

The value of resistors R1H1, R2H1, and R3H1 is determined such that the first hysteresis comparator 630 is configured to detect the high current pulse 212 of the triggering electrical current waveform 190 (see e.g., FIG. 2) when the monitored voltage Vm 825 is applied to its negative terminal. In some implementations, the trip level of the comparator 632 may be set to two volts with a hysteresis range of ±200 mV by appropriately selecting the value of resistors R1H1, R2H1, and R3H1. The selected resistor values may configure the first hysteresis comparator 630 for detecting a high current pulse 212 having an amplitude substantially equal to A1 (e.g., 3 A). Upon detection of the high current pulse 212 having the expected amplitude A1 and a duration TD1, the first hysteresis comparator 630 may generate a corresponding first voltage pulse 635 having a duration substantially equal to TD1.

The value of resistors R1H2, R2H2 and R3H2 is determined such that the second hysteresis comparator 640 is configured to detect the low current pulse 213 of the triggering electrical current waveform 190 (see FIG. 2) when the monitored voltage Vm 825 is applied to its negative terminal. In some implementations, the trip level of the comparator 642 may be set to 0.6 volts with a hysteresis range of ±200 mV by appropriately selecting the value of resistors R1H2, R2H2, and R3H2. The selected resistor values may configure the second hysteresis comparator 640 for detecting a low current pulse 213 having an amplitude substantially equal to A2 (e.g., 1 A). Upon detection of the low current pulse 213 having the expected amplitude A2 and a duration TD2, the second hysteresis comparator 640 may generate a corresponding second voltage pulse 645 having a duration substantially equal to TD2. As previously noted, the second hysteresis comparator 640 may also detects the high current pulse 212 and may generate a corresponding first voltage pulse having a duration substantially equal to TD1.

Reference is now made concurrently to FIGS. 2A, 3, 6, 9A, and 9B. FIGS. 9A and 9B are examples of the triggering electrical current waveform shown in FIG. 2 and voltage pulses detecting the characteristics of the triggering electrical current waveform according to some aspects of the present disclosure. The monitoring unit 300 processes the respective voltage pulses 635 and 645 generated by the first hysteresis comparator 630 and the second hysteresis comparator 640. The monitoring unit 300 may include a processing unit (not shown) configured to execute the monitoring algorithm 315. The processing unit of the monitoring unit 300 may be a Digital Signal Processor (DSP) or other processor. The DSP may include enhanced capture (eCAP) modules configured to receive the respective voltage pulses 635 and 645 generated by the first and second hysteresis comparators 630 and 640, respectively. The eCAP modules may be configured for measuring accurate timings of external events. The timing resolution of the eCAP modules may be configured to measure the duration TD1 of the high current pulse 212 and the duration TD2 of the low current pulse(s) 213a-213c as well as the time periods T1 and T2 of the triggering electrical current waveform 190 shown in FIG. 2. The timing resolution may be 10 nanoseconds or less.

In some implementations, the processing unit of the monitoring unit 300 may be implemented by a standard processor, an application-specific integrated circuit (ASIC), a field-programmable gate array (FPGA), etc. In these implementations, the monitoring unit 300 may include an equivalent of the eCAP modules of the DSP. In some implementations, the monitoring unit 300 may include a precise clock unit (not shown) for determining when the respective voltage pulses 635 and 645 generated by the first and second hysteresis comparators 630 and 640, respectively, are received by the monitoring unit 300. In some implementations, the monitoring unit 300 may include at least one communication interface (not shown), for example, an interface for Ethernet communication, Wi-Fi communication, optical fiber communication, etc., for exchanging data with other computing devices, for example, but not limited to, the control node 150.

Referring to FIG. 9A, when the first hysteresis comparator 630 detects an occurrence of a high current pulse 212 in the triggering electrical current waveform 190 having substantially the amplitude A1, the first hysteresis comparator 630 may generate and transmit a voltage pulse 635 to the monitoring unit 300. The transmitted voltage pulse 635 may have a duration TD1 corresponding to a duration of the detected high current pulse 212 in the triggering electrical current waveform 190. Upon receiving the voltage pulse 635, the monitoring algorithm 315 may record the duration TD1 of the voltage pulse 635 and may also record a time of arrival t1 of the voltage pulse 635.

Referring to FIG. 9B, when the second hysteresis comparator 640 detects an occurrence of a low current pulse 213a-213c in the triggering electrical current waveform 190 having substantially the amplitude A2, the second hysteresis comparator 640 may generate and transmit a voltage pulse 645a-645c to the monitoring unit 300. The transmitted voltage pulse 645a-645c may have a duration Td2 corresponding to a duration of the detected low current pulse 213a-213c in the triggering electrical current waveform 190. Upon receiving of the voltage pulse 645a, the monitoring algorithm 315 may record the duration Td2 of the voltage pulse 645a and may also record a time of arrival t2 of the voltage pulse 645a. The monitoring algorithm 315 may further record the duration and timing of subsequent voltage pulses corresponding to detected low current pulses.

The second hysteresis comparator 640 may also detect an occurrence of the high current pulse 212 in the triggering electrical current waveform 190. When the second hysteresis comparator 640 detects the high current pulse 212, the second hysteresis comparator 640 may generate and transmit a voltage pulse 646 to the monitoring unit 300. The transmitted voltage pulse 646 may have a duration Td1' corresponding to the duration of the detected high current pulse 212 in the triggering electrical current waveform 190. Upon receiving of the voltage pulse 646, the monitoring algorithm 315 may record the duration Td1' of the voltage pulse 646 and may also record a time of arrival t1' of the voltage pulse 646.

As shown in FIG. 9A, the monitored voltage 825 tracks the triggering electrical current waveform 190. A single voltage pulse 635 corresponding to the high current pulse 212 may be generated by the first hysteresis comparator 640. As shown in FIG. 9B, a voltage pulse 646 corresponding to the high current pulse 212 of the triggering electrical current waveform 190 may also be generated by the second hysteresis comparator 640. Since in FIG. 9B the illustrated triggering electrical current waveform 190 includes three low current pulses 213a-213c, three consecutive voltage pulses 645a-645c are further generated by the second hysteresis comparator 640 corresponding to the three low current pulses 213a-213c. Thus, a total of four voltage pulses are generated. While three low current pulses and three corresponding voltage pulses are illustrated in FIG. 9B, more or fewer low current pulses may be generated without departing from the scope of the present disclosure.

According to some aspects of the present disclosure, at least some of the following analysis operations may be performed by the monitoring algorithm 315 to determine whether the triggering electrical current waveform 190 is compliant with pre-defined amplitude, duration, and timing characteristics. For each triggering electrical current waveform 190, a single voltage pulse 635 corresponding to a high current pulse 212 and several voltage pulses 645a-645c corresponding to low current pulses 213a-213c may be received when the triggering electrical current waveform 190 is compliant with the pre-defined characteristics.

Simultaneously with the reception of the voltage pulse 635 corresponding to a high current pulse of the triggering electrical current waveform 190 from the first hysteresis comparator 630, a voltage pulse 646 corresponding to the high current pulse of the triggering electrical current waveform 190 from the second hysteresis comparator 640 may also be received by the monitoring circuit 300. The simultaneous voltage pulses 635 and 646 correspond to a detection of the same high current pulse 212 of the triggering electrical current waveform 190.

In some implementations, the monitoring algorithm 315 may ignore the voltage pulse 646 received from the second hysteresis comparator 640 simultaneously with the reception of the voltage pulse 635 from the first hysteresis comparator 630. The monitoring algorithm 315 may operate only on the voltage pulses 645a-645c corresponding to the low current pulses 213a-213c of the triggering electrical current waveform 190 received from the second hysteresis comparator 640.

In some implementations, the monitoring algorithm 315 may operate on the voltage pulse 646 received from the second hysteresis comparator 640 simultaneously with the reception of the voltage pulse 635 from the first hysteresis comparator 630 as well as the following voltage pulses 645a-645c corresponding to the low current pulses of the triggering electrical current waveform 190 received from the second hysteresis comparator 640.

The analysis may include determining whether the duration Td1 of the voltage pulse 635 (see FIG. 9A) that is generated by the first hysteresis comparator 630 is equal to an expected duration TD1 of the high current pulse 212 of the triggering electrical current waveform 190 within a specified margin of error. The specified margin of error may be, for example, ±5% or another margin of error.

Optionally, the analysis may also include determining whether the duration Td1' of the voltage pulse 646 (see FIG. 9B) that is generated by the second hysteresis comparator 640 simultaneously with the voltage pulse 635 and that is generated by the first hysteresis comparator 630 is equal to an expected duration TD1 of the high current pulse 212 of the triggering electrical current waveform 190 within a specified margin of error. The specified margin of error may be, for example, ±5% or another margin of error. This analysis may determine whether the voltage pulse 646 that is generated by the second hysteresis comparator 640 effectively corresponds to the voltage pulse 635 that is generated by the first hysteresis comparator 630 to verify that the voltage pulse has been triggered by the high current pulse 212 of the triggering electrical current waveform 190.

The analysis may further include determining whether the duration Td2 of each voltage pulse 645a-645c (see FIG. 9B) corresponding to the low current pulses 213a-213c of the triggering electrical current waveform 190 that are generated by the second hysteresis comparator 640 following the voltage pulse 635 that is generated by the first hysteresis comparator 630 is equal to the expected duration TD2 of the low current pulse 213a of the triggering electrical waveform 190 within a specified margin of error. The specified margin of error may be, for example, ±5% or another margin of error.

The analysis may further include determining whether the voltage pulse 635 that is generated by the first hysteresis comparator 630 is followed by an expected number N of voltage pulses 645a-645c that are generated by the second hysteresis comparator 640, where N is an integer number of voltage pulses corresponding to an expected number of low current pulses following a high current pulse 212. For example, referring to FIG. 9B, N equals three voltage pulses 645a-645c that are generated by the second hysteresis comparator 640 corresponding to the low current pulses 213a-213c of the triggering electrical waveform 190. Alternatively, the analysis may further include determining whether a total of N+1 voltage pulses that are generated by the second hysteresis comparator 640 are received (e.g., four as illustrated in FIG. 9B) including the voltage pulse 646 corresponding to the high current pulse 212 that is also detected by the second hysteresis comparator 640.

This analysis may determine whether the amplitude of one or more low current pulses 213a-213c of the triggering electrical current waveform 190 is compliant with the expected amplitude A2, for example, one amp or another amplitude. When the amplitude of one or more low current pulses 213a-213c of the triggering electrical current waveform 190 is not compliant with the expected amplitude A2, the second hysteresis comparator 640 is not triggered by the monitored voltage 825 and no voltage pulse 645 is generated by the second hysteresis comparator 640 or received by the monitoring unit 300 for at least one of the one or more low current pulse 213a-213c.

The analysis may further include determining whether the time of arrival t1 at the monitoring circuit 300 as recorded by the monitoring algorithm 315 of the voltage pulse 635 in FIG. 9A that is generated by the first hysteresis comparator 630 is equal to an expected time of arrival t_exp within a specified margin of error. The specified margin of error may be, for example, t1 less than t_exp+1 ms or another margin of error. For example, the expected time of arrival t_exp may be determined based on the reception of a triggering signal/message (not shown) transmitted by the control node 150 to the monitoring unit 300 prior to generating a new triggering electrical current waveform 190 via the pulse generator 160. In some implementations, t_exp may be equal to a time of reception of the triggering signal transmitted by the control node 150 corrected by a time delay corresponding to a delay before the effective generation and detection of the new triggering electrical current waveform 190 occurs. In some implementations, the value of t_exp may be included in the triggering message transmitted by the control node 150.

In some implementations, the monitoring algorithm 315 may only determine whether or not a voltage pulse 635 generated by the first hysteresis comparator 630 is received at the expected time of arrival t_exp within the specified margin of error. This analysis may determine whether the detected amplitude of the high current pulse 212 of the triggering electrical current waveform 190 is compliant with the expected amplitude A1, for example, 3 A or another amplitude. When the detected amplitude of the high current pulse 212 of the triggering electrical current waveform 190 is not compliant with the expected amplitude A1, the first hysteresis comparator 630 may not be triggered by the monitored voltage 825 and no voltage pulse 635 is generated by the first hysteresis comparator 630 or received by the monitoring unit 300.

Optionally, the analysis may further include determining whether the time of arrival t1' at the monitoring circuit 300 as recorded by the monitoring algorithm 315 of the voltage pulse 646 generated by the second hysteresis comparator 640 simultaneously with the voltage pulse 635 generated by the first hysteresis comparator 630, is equal to the expected time of arrival t_exp within a specified margin of error. The specified margin of error may be, for example, t1' less than t_exp+1 ms or another margin of error. This analysis may determine whether voltage pulse 646 generated by the second hysteresis comparator 640 effectively corresponds to the voltage pulse 635 generated by the first hysteresis comparator 630 to verify that the voltage pulse has been triggered by the high current pulse 212 of the triggering electrical current waveform 190.

The analysis may further include determining whether a difference between the time of arrival t2 at the monitoring circuit 300 as recorded by the monitoring algorithm 315 of the first voltage pulse 645a generated by the second hysteresis comparator 640 following the voltage pulse 635 and corresponding to the low current pulse 213a of the triggering electrical current waveform 190, and the time of arrival t1 of the voltage pulse 635 generated by the first hysteresis comparator 630, is equal to the sum of the expected duration TD1 of the high current pulse 212 and the expected time interval T1 between the end of the high current pulse 212 and the beginning of the first among the following low current pulses 213a-213c within a specified margin of error. The specified margin of error may be, for example, ±5% or another margin of error.

The analysis may further include determining whether a difference between the respective times of arrival t2 and t3 of two consecutive voltage pulses 645a and 645b, respectively, generated by the second hysteresis comparator 640 following the voltage pulse 635 generated by the first hysteresis comparator 630 and corresponding to two consecutive low current pulses 213a, 213b of the triggering electrical current waveform 190, is equal to the sum of the expected duration TD2 of the low current pulse 213a and the expected time interval T2 between the end of the low current pulse 213a and the beginning of the next low current pulse 213b within a specified margin of error. The specified margin of error may be, for example, ±5%).

While several analysis operations have been explained above, some of the aforementioned analysis operations may not be implemented by the monitoring algorithm 315 and/or additional analysis operations may be implemented by the monitoring algorithm 315. Furthermore, the monitoring algorithm 315 may implement analysis operations that may be adapted to a different shape of the triggering electrical current waveform 190.

Upon failure of one or more of the aforementioned analysis operations, the monitoring algorithm 315 may determine that the triggering electrical current waveform 190 is not compliant with the expected triggering electrical current waveform characteristics. In such cases, the monitoring algorithm 315 may be configured to perform at least one of the following actions: transmitting an error message to one or more master controllers, for example, but not limited to, to the control node 150, triggering a visual and/or sound alarm, or other error notification action. Optionally, the type of error identified by the monitoring algorithm 315 (e.g., a noncompliant duration of the high current pulse, a noncompliant number of consecutive low current pulses, etc.) may also be notified to the one or more master controllers.

In some implementations, the monitoring algorithm 315 may be configured to perform analysis operations for determining, based on the output signal 322 of the current sensor 320, whether the primary electrical current 140 is flowing through the thyristor 100 and whether the characteristics (e.g., frequency, average current amplitude, maximum current amplitude, wave shape of the current, etc.) of the primary electrical current 140 are adequate.

The analysis operations may include determining whether a time of arrival t' of the output signal 322 of the current sensor 320 received by the monitoring algorithm 315 is equal to an expected time of arrival t'_exp within a specified margin of error. The specified margin of error may be, for example, t' less than t'_exp +1 ms. For example, the expected time of arrival t'_exp may be determined based on the reception of a triggering signal/message (not shown) transmitted by the control node 150 to the monitoring unit 300 prior to generating a new triggering electrical current waveform 190 via the pulse generator 160. In some implementations, t'_exp may be equal to a time of reception of the triggering signal transmitted by the control node 150 corrected by a time delay corresponding to a delay before the effective generation of the new triggering electrical current waveform 190 and the corresponding flow of the primary electrical current 140 occur. In some implementations, the value of t'_exp may be included in the triggering message transmitted by the control node 150. In some implementations, the monitoring algorithm 315 may simply determine whether or not an output signal 322 of the current sensor 320 is received at the expected time of arrival t'_exp within the specified margin of error.

The analysis operations may further include determining whether one or more characteristic of the output signal 322 is compliant with a pre-defined value within a specified a margin of error for each type of characteristic. The characteristics of the output signal 322 are representative of corresponding characteristics of the primary electrical current 140. By determining the compliance of the characteristics of the output signal 322, one or more of the characteristics of the electrical current 140 (e.g., current frequency, average current amplitude, maximum current amplitude, wave shape of the current, etc.) may be verified While several analysis operations related to the current sensor 320 have been explained above, some of the aforementioned analysis operations may not be implemented by the monitoring algorithm 315 and/or additional analysis operations may be implemented by the monitoring algorithm 315.

Upon failure to pass one or more of the aforementioned tests, the monitoring algorithm 315 may determine that the primary electrical current 140 is not flowing in the thyristor 100, or that the primary electrical current 140 is flowing but is not compliant with the pre-defined characteristics. In such cases, the monitoring algorithm 315 may be configured to perform at least one of the following actions: transmitting an error message to one or more master controllers, for example, but not limited to, to the control node 150, triggering a visual and/or sound alarm, or other error notification action. Optionally, the type of error identified by the monitoring algorithm 315 (e.g., a noncompliant duration of the high current pulse, a noncompliant number of consecutive low current pulses, etc.) may also be notified to the one or more master controllers.

Figure 10:
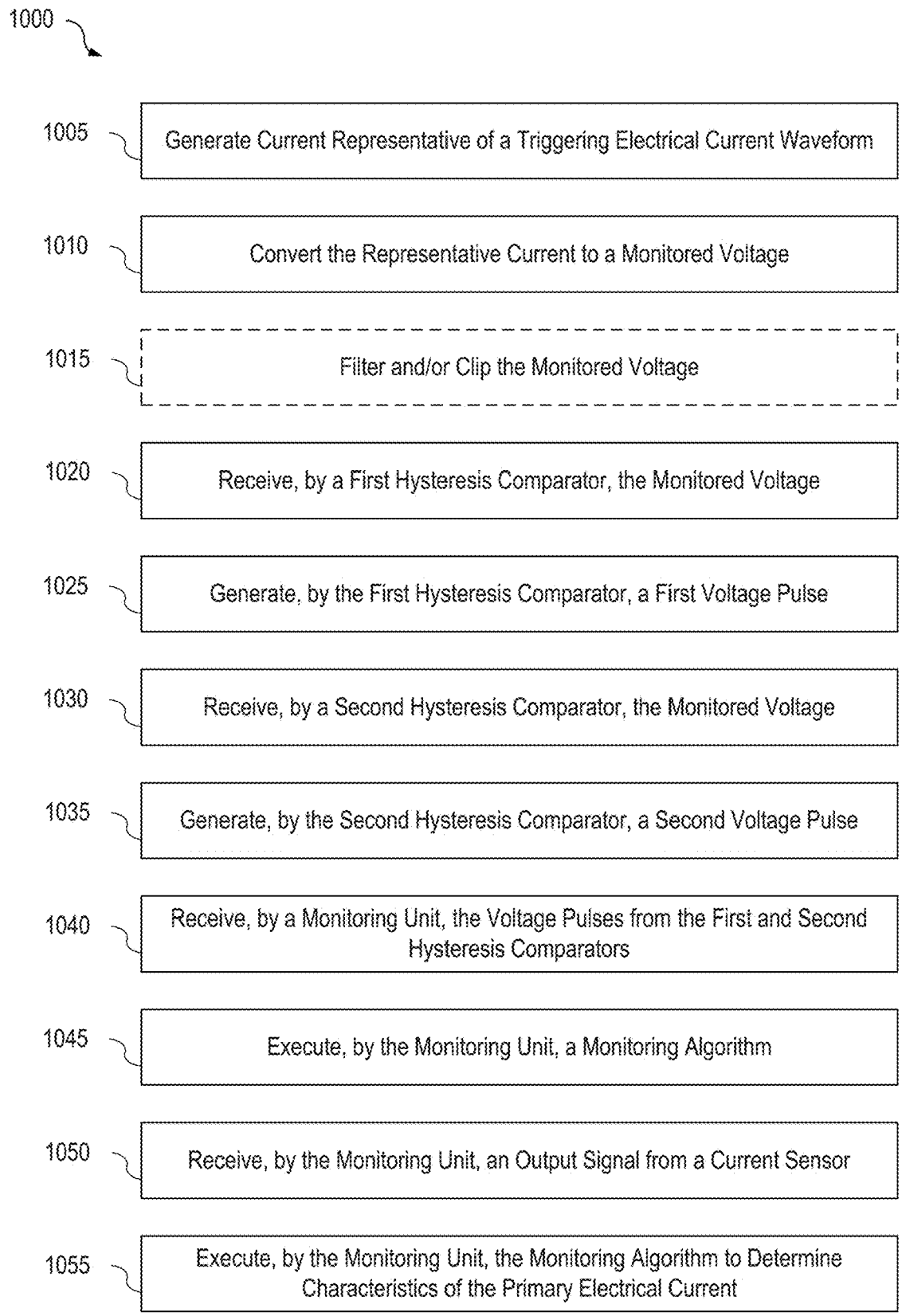
FIG. 10 is a flowchart illustrating example methods for monitoring the polarization and conduction of the thyristor according to some aspects of the present disclosure.

FIG. 10 illustrates a flowchart of a method for monitoring the polarization and conduction of a thyristor according to some aspects of the present disclosure. The method 1000 may be implemented by the system illustrated and described in the previous figures. Referring to FIG. 10, at block 1005, a current representative of a triggering electrical current waveform may be generated. A current transformer may be configured to generate a secondary electrical current representative of the triggering electrical current waveform supplied to a gate of a thyristor. The triggering electrical current waveform may be supplied to the gate of the thyristor via a conductor. The current transformer may be configured to sense the triggering electrical current waveform carried by the conductor.

At block 1010, the representative electrical current may be converted to a monitored voltage. A current-to-voltage converter may be configured to convert the electrical current representative of the triggering electrical current waveform to a voltage. The current-to-voltage converter may be implemented, for example, by the resistor R1 of a conditioning circuit (e.g., the conditioning circuit 620) configured to generate the monitored voltage.

At block 1015, the monitored voltage may optionally be filtered and/or clipped. At least one of low-pass filtering and/or negative voltage clipping may be applied to the monitored voltage. For example, the low-pass filtering may be implemented by the capacitor C1 of the conditioning circuit. The negative voltage clipping may be implemented by the diode D1 of the conditioning circuit.

At block 1020, the monitored voltage may be received by a first hysteresis comparator. The first hysteresis comparator may be configured to process the monitored voltage output of the conditioning circuit. By processing the monitored voltage output of the conditioning circuit, the first hysteresis comparator may detect a high current pulse of the electrical current representative of the triggering electrical current waveform.

At block 1025, the first hysteresis comparator may generate a first voltage pulse. The first hysteresis comparator may generate the first voltage pulse when the triggering electrical current waveform includes a high current pulse having a specified amplitude (e.g., the amplitude A1 as illustrated in FIG. 2A). A duration of the first voltage pulse may be substantially equal to the duration TD1 of the high current pulse as illustrated in FIG. 2A.

At block 1030, the monitored voltage may be received by a second hysteresis comparator. The second hysteresis comparator may be configured to process the monitored voltage output of the conditioning circuit. By processing the monitored voltage output of the conditioning circuit, the second hysteresis comparator may detect one or more low current pulses of the electrical current representative of the triggering electrical current waveform.

At block 1035, the second hysteresis comparator may generate a second voltage pulse. The second hysteresis comparator may generate one or more second voltage pulses when the triggering electrical current waveform includes one or more low current pulses having a specified amplitude (e.g., the amplitude A2 as illustrated in FIG. 2A). A duration of each of the one or more second voltage pulses may be substantially equal to the duration TD2 of the low current pulses as illustrated in FIG. 2A. The second hysteresis comparator may also generate a voltage pulse concurrently with the first voltage pulse generated by the first hysteresis comparator when the triggering electrical current waveform includes the high current pulse having an amplitude A1.

At block 1040, the voltage pulses from first and second hysteresis comparators may be received by a monitoring unit. The first voltage pulse from the first hysteresis comparator and the one or more second voltage pulses from the second hysteresis comparator may be received by the monitoring unit. The first voltage pulse from the first hysteresis comparator may correspond to the high current pulse of the triggering electrical current waveform and the one or more second voltage pulses from the second hysteresis comparator may correspond to the one or more low current pulses of the triggering electrical current waveform.

At block 1045, the monitoring unit may execute a monitoring algorithm. The monitoring algorithm may be configured to determine, based on the first voltage pulse and the one or more second voltage pulses, whether the triggering electrical current waveform is compliant with pre-defined characteristics. For example, the monitoring algorithm may determine whether the amplitude, duration, and timing characteristics of the triggering electrical current waveform comply with the pre-defined characteristics for the triggering electrical current waveform.

At block 1050, an output signal from a current sensor may be received. The monitoring unit may receive an output signal from the current sensor. The current sensor may generate the output signal when the primary electrical current is flowing between the anode and the cathode of the thyristor.

At block 1055, the monitoring unit may execute the monitoring algorithm to determine the characteristics of the primary electrical current. The monitoring unit may execute the monitoring algorithm based on the output signal of the current sensor. The monitoring algorithm may determine whether the characteristics of the primary electrical current flowing between the anode and the cathode of the thyristor is compliant with pre-defined characteristics for the primary electrical current. For example, the monitoring algorithm may determine whether the frequency, average current amplitude, maximum current amplitude, wave shape of the current, etc., of the primary electrical current comply with the pre-defined characteristics for the primary electrical current.

Additional details related to the implementation of the steps of the method 1000 have been described above, in particular with respect to the analysis operations implemented by the monitoring algorithm at blocks 1045 and 1055.

The specific operations illustrated in FIG. 10 provide a particular method for monitoring the polarization and conduction of a thyristor according to an embodiment of the present disclosure. Other sequences of operations may also be performed according to alternative embodiments. For example, alternative embodiments of the present disclosure may perform the operations outlined above in a different order. Moreover, the individual operations illustrated in FIG. 10 may include multiple sub-operations that may be performed in various sequences as appropriate to the individual operation. Furthermore, additional operations may be added or removed depending on the particular applications.

The method 1000, may be embodied on a non-transitory computer readable medium, for example, but not limited to, a memory (not shown) or other non-transitory computer readable medium known to those of skill in the art, having stored therein a program including computer executable instructions for making a processor, computer, or other programmable device execute the operations of the methods.

The examples and embodiments described herein are for illustrative purposes only. Various modifications or changes in light thereof will be apparent to persons skilled in the art. These are to be included within the spirit and purview of this application, and the scope of the appended claims, which follow.

What is claimed is:

1. A system comprising:
a thyristor;
a current transformer configured to generate a secondary electrical current from a triggering electrical current waveform, wherein the triggering electrical current waveform is applied to a gate of the thyristor;
a current to voltage converter configured to convert the secondary electrical current into a monitored voltage;
a first hysteresis comparator configured to receive the monitored voltage and to generate a first voltage pulse corresponding to a first current pulse having a first amplitude of the triggering electrical current waveform, wherein a duration of the first voltage pulse corresponds to a duration of the first current pulse;
a second hysteresis comparator configured to receive the monitored voltage and to generate one or more second voltage pulses corresponding to one or more second current pulses having a second amplitude of the triggering electrical current waveform, wherein a duration of each of the one or more second voltage pulses corresponds to a duration of each of the one or more second current pulses, and wherein the first amplitude is higher than the second amplitude; and
a monitoring unit configured to receive the first voltage pulse from the first hysteresis comparator and the one or more second voltage pulses from the second hysteresis comparator, wherein the monitoring unit is further configured to determine based on the first voltage pulse and the one or more second voltage pulses whether the triggering electrical current waveform is compliant with pre-defined characteristics.

2. The system of claim 1, wherein determining whether the triggering electrical current waveform is compliant with pre-defined characteristics comprises determining if the duration of the first voltage pulse is equal to a pre-defined duration.

3. The system of claim 1, wherein determining whether the triggering electrical current waveform is compliant with pre-defined characteristics comprises determining whether the duration of each of the one or more second voltage pulses is equal to a pre-defined duration.

4. The system of claim 1, wherein determining whether the triggering electrical current waveform is compliant with pre-defined characteristics comprises determining whether receiving the first voltage pulse is followed by receiving a number N of second voltage pulses, N being an integer greater than or equal to 1.

5. The system of claim 1, wherein determining if the triggering electrical current waveform is compliant with pre-defined characteristics comprises determining whether the first voltage pulse is received at an expected time of arrival.

6. The system of claim 1, further comprising a current sensor, wherein the monitoring unit is further configured to receive an output signal from the current sensor, wherein the current sensor is configured to generate the output signal based on an electrical current flowing between an anode and a cathode of the thyristor, and wherein the monitoring unit is further configured to determine based on the output signal whether the electrical current flowing between the anode and the cathode of the thyristor is compliant with additional pre-defined characteristics.

7. The system of claim 6, wherein determining whether the electrical current flowing between the anode and the cathode of the thyristor is compliant with additional pre-defined characteristics comprises determining whether the output signal is received at an expected time of arrival.

8. The system of claim 6, wherein determining whether the electrical current flowing between the anode and the cathode of the thyristor is compliant with additional pre-defined characteristics comprises analyzing the output signal to determine whether the electrical current flowing between the anode and the cathode of the thyristor is compliant with at least one of a frequency, an average current amplitude, a maximum current amplitude, or a wave shape of the current.

9. The system of claim 1, further comprising at least one of a low-pass filter and a negative voltage clipper applied to the monitored voltage.

10. A method for monitoring polarization and conduction of a thyristor, the method comprising:
generating, by a current transformer, a secondary electrical current from a triggering electrical current waveform, wherein the triggering electrical current waveform is applied to a gate of the thyristor;
converting, by a current to voltage converter, the secondary electrical current into a monitored voltage;
receiving, by a first hysteresis comparator, the monitored voltage;
generating, by the first hysteresis comparator, a first voltage pulse corresponding to a first current pulse having a first amplitude of the triggering electrical current waveform, wherein a duration of the first voltage pulse corresponds to a duration of the first current pulse;
receiving, by a second hysteresis comparator, the monitored voltage;
generating, by the second hysteresis comparator, one or more second voltage pulses corresponding to one or more second current pulses having a second amplitude of the triggering electrical current waveform, wherein a duration of each of the one or more second voltage pulse corresponds to a duration of each of the one or more second current pulses, the first amplitude being higher than the second amplitude;

receiving, by a monitoring unit, the first voltage pulse from the first hysteresis comparator and the one or more second voltage pulses from the second hysteresis comparator; and executing, by the monitoring unit a monitoring algorithm for determining based on the first voltage pulse and the one or more second voltage pulses whether the triggering electrical current waveform is compliant with pre-defined characteristics.

11. The method of claim 10, wherein determining whether the triggering electrical current waveform is compliant with pre-defined characteristics comprises determining whether the duration of the first voltage pulse is equal to a pre-defined duration.

12. The method of claim 10, wherein determining whether the triggering electrical current waveform is compliant with pre-defined characteristics comprises determining whether the duration of each of the one or more second voltage pulses is equal to a pre-defined duration.

13. The method of claim 10, wherein determining whether the triggering electrical current waveform is compliant with pre-defined characteristics comprises determining whether receiving the first voltage pulse is followed by receiving a number N of second voltage pulse, N being an integer greater than or equal to 1.

14. The method of claim 10, wherein determining whether the triggering electrical current waveform is compliant with pre-defined characteristics comprises determining whether the first voltage pulse is received at an expected time of arrival.

15. The method of claim 10, further comprising receiving, by the monitoring unit, an output signal from a current sensor based on an electrical current flowing between an anode and a cathode of the thyristor, the monitoring algorithm further determining based on the output signal whether the electrical current flowing between the anode and the cathode of the thyristor is compliant with additional pre-defined characteristics.

16. The method of claim 15, wherein determining whether the electrical current flowing between the anode and the cathode of the thyristor is compliant with additional pre-defined characteristics comprises determining whether the output signal is received at an expected time of arrival.

17. The method of claim 15, wherein determining whether the electrical current flowing between the anode and the cathode of the thyristor is compliant with additional pre-defined characteristics comprises analyzing the output signal to determine whether the electrical current flowing between the anode and the cathode of the thyristor is compliant with at least one of a frequency, an average current amplitude, a maximum current amplitude, or a wave shape of the current.

18. The method of claim 10, further comprising at least one of applying a low pass filtering and applying a negative voltage clipping to the monitored voltage.

19. A system for monitoring polarization and conduction of a thyristor, the system comprising:

a first hysteresis comparator configured to generate a first voltage pulse corresponding to a first current pulse having a first amplitude and duration of a triggering electrical current waveform applied to a gate of the thyristor;

a second hysteresis comparator configured to generate at least one second voltage pulse corresponding to at least one second current pulse having a second amplitude and duration of the triggering electrical current waveform applied to the gate of the thyristor, wherein the first amplitude is higher than the second amplitude; and a monitoring unit configured to determine based on the first voltage pulse and the at least one second voltage pulse whether the triggering electrical current waveform is compliant with pre-defined characteristics.

20. The system of claim 19, further comprising a current sensor configured to generate an output signal based on an electrical current flowing between an anode and a cathode of the thyristor, wherein the monitoring unit is further configured to receive the output signal from the current sensor and to determine based on the output signal whether the electrical current flowing between the anode and the cathode of the thyristor is compliant with additional pre-defined characteristics.

* * * * *